United States Patent
Zeng et al.

(10) Patent No.: US 12,199,217 B2
(45) Date of Patent: Jan. 14, 2025

(54) LIGHT-EMITTING CHIP AND DEVICE USING THE SAME

(71) Applicant: Luminus (Xiamen) Co., Ltd., Fujian (CN)

(72) Inventors: Xiaoqiang Zeng, Fujian (CN); Kunte Lin, Fujian (CN); Jianfeng Yang, Fujian (CN); Kaiqing Xu, Fujian (CN); Shao-Hua Huang, Fujian (CN)

(73) Assignee: LUMINUS (XIAMEN) CO., LTD., Fujian (CN)

( * ) Notice: Subject to any disclaimer, the term of this patent is extended or adjusted under 35 U.S.C. 154(b) by 381 days.

(21) Appl. No.: 17/568,135

(22) Filed: Jan. 4, 2022

(65) Prior Publication Data
US 2022/0216372 A1    Jul. 7, 2022

(30) Foreign Application Priority Data

Jan. 5, 2021 (CN) .......................... 202110007123.8
May 8, 2021 (CN) .......................... 202110500339.8

(51) Int. Cl.
| | |
|---|---|
| H01L 33/38 | (2010.01) |
| G03B 21/20 | (2006.01) |
| H01L 25/075 | (2006.01) |
| H01L 33/32 | (2010.01) |
| H01L 33/62 | (2010.01) |

(52) U.S. Cl.
CPC ........ *H01L 33/382* (2013.01); *G03B 21/2033* (2013.01); *H01L 25/0753* (2013.01); *H01L 33/325* (2013.01); *H01L 33/62* (2013.01)

(58) Field of Classification Search
CPC ....... H01L 33/36; H01L 33/38; H01L 33/382; H01L 33/32
See application file for complete search history.

(56) References Cited

U.S. PATENT DOCUMENTS

| | | | | |
|---|---|---|---|---|
| 6,100,546 A | * | 8/2000 | Major ..................... | H01L 33/32 257/103 |
| 6,577,006 B1 | * | 6/2003 | Oota ........................ | H01L 33/40 257/745 |

(Continued)

FOREIGN PATENT DOCUMENTS

CN    104241486 A    12/2014

OTHER PUBLICATIONS

Search Report appended to an Office Action, which was issued to Chinese counterpart application No. 202110500339.8 by the CNIPA on Feb. 23, 2022, with an English translation thereof.

*Primary Examiner* — Peter M Albrecht
(74) *Attorney, Agent, or Firm* — MUNCY, GEISSLER, OLDS & LOWE, P.C.

(57) ABSTRACT

A light-emitting chip includes a light-emitting unit, first and second electrode units. The light-emitting unit includes first and second conductivity type semiconductor layers and an active layer. The first electrode unit includes two first electrodes which are spaced apart from each other by a first distance, and which are electrically connected to the first conductivity type semiconductor layer. The second electrode unit includes two second electrodes electrically connected to the second conductivity type semiconductor layer. The first and second electrode units are spaced apart from each other by a second distance, and the first distance is greater than the second distance.

26 Claims, 7 Drawing Sheets

(56) References Cited

U.S. PATENT DOCUMENTS

| | | | |
|---|---|---|---|
| 2004/0053478 A1* | 3/2004 | Moustakas | H01L 33/32 |
| | | | 438/479 |
| 2005/0167690 A1* | 8/2005 | Gardner | H01L 33/32 |
| | | | 257/103 |
| 2006/0192223 A1* | 8/2006 | Lee | H01L 33/38 |
| | | | 257/99 |
| 2015/0123160 A1* | 5/2015 | Hsu | H01L 25/0753 |
| | | | 257/99 |
| 2021/0313486 A1* | 10/2021 | Tsai | H01L 33/06 |

* cited by examiner

LIGHT-EMITTING CHIP AND DEVICE USING THE SAME

CROSS-REFERENCE TO RELATED APPLICATION

This application claims priority of Chinese Invention Patent Application No. 202110007123.8, filed on Jan. 5, 2021, and Chinese Invention Patent Application No. 202110500339.8, filed on May 8, 2021.

FIELD

The disclosure relates to a light-emitting diode (LED), and more particularly to a light-emitting chip and a light-emitting device including the same. The disclosure also relates to an optical-projecting device.

BACKGROUND

In some applications, light-emitting chips are required to have a high current density. For example, each of the light-emitting chip in the micro projector currently on market may include a blue/green channel that requires a current density of 5 A/mm$^2$ to 6 A/mm$^2$, and a red channel that requires a current density of 4 A/mm$^2$ to 5 A/mm$^2$. In addition, certain light-emitting products may have two 2.0 mm$^2$ ultra-vertical chips electrically connected in parallel to obtain a 4.0 mm$^2$ light-emitting surface in the blue channel, and the driving current required for the ultra-vertical chips can reach as high as 20 A.

The driving current of a 2.0 mm$^2$ horizontal and vertical chip may be 10 A at 5 A/mm$^2$, and may even reach 12 A at 6 A/mm$^2$. In consideration of the fact that the driving current continues to increase, and that selection of a power supply for the product (e.g., a light-emitting chip) becomes more stringent, a horizontal and vertical chip structure have been introduced into the market to be made into a tandem high-voltage low-current light source.

With continued increase of current density, the need for chip current distribution and thermal management of chip package have also increased. The substrates in horizontal and use of insulating vertical chips can achieve wafer-level thermoelectric separation. In addition of optimizing via configuration (e.g., blue/green channel(s)) and extension bar configuration (e.g., red channel(s) of a P side up light-emitting chip), electrode distribution also has a significant impact on current distribution. In a product with a high current density demand and/or being made of semiconductor materials with a low carrier mobility, optimization of electrode distribution in a light-emitting chip is required in order to improve current distribution.

Referring to FIGS. 1 and 2, a conventional light-emitting chip 1 is provided. FIG. 2 is a perspective front view of the conventional light-emitting chip 1 shown in FIG. 1. The conventional light-emitting chip 1 includes an N-type electrode 11 and a P-type electrode 12 (i.e., an electrode layout of 1P1N). The conventional light-emitting chip further includes a semiconductor stack 13 containing a first conductivity type semiconductor layer 131 (N-type), a second conductivity type semiconductor layer (P-type) 132, and a photoelectric active layer 133 disposed between the first conductivity type semiconductor layer 131 and the second conductivity type semiconductor layer 132.

The N-type electrode 11 is electrically connected to the first conductivity type semiconductor layer 131 through a first electrical connection layer 14. The first electrical connection layer 14 contacts at least a part of a bottom portion of the first conductivity type semiconductor layer 131, and is disposed between the first conductivity type semiconductor layer 131 and a permanent substrate 10.

The first electrical connection layer 14 has an exposed portion that is exposed from the first conductivity type semiconductor layer 131 and that forms a first platform 141. The N-type electrode 11 is formed on the exposed portion (i.e., first platform 141) of the first electrical connection layer 14. The first platform 141 provides an electrical connection (e.g., N-type electrical connection) between the N-type electrode 11 and the first conductivity type semiconductor layer 131.

In some wafer manufacturing processes, the first conductivity type semiconductor layer 131, the second conductivity type semiconductor layer 132, and the photoelectric active layer 133 of the semiconductor stack 13 are sequentially grown by vapor deposition on a growth substrate (not shown), and then the growth substrate is peeled off from the semiconductor stack 13, followed by forming the first electrical connection layer 14 on the first conductivity type semiconductor layer 131. The first electrical connection layer 14 is then connected to the permanent substrate 10.

A second electrical connection layer 15 might be disposed between the P-type electrode 12 and the second conductivity type semiconductor layer 132. The second electrical connection layer 15 functions as a second platform 151 for supporting the P-type electrode 12, and provides electrical connection between the P-type electrode 12 and the second conductivity type semiconductor layer 132. The second electrical connection layer 15 might include a metal layer, a transparent current spread layer, or a doped semiconductor layer. The P-type electrode 12 and the first electrical connection layer 14 are respectively arranged on opposite sides of the semiconductor stack 13. An electric current is vertically injected from the P-type electrode 12 into the semiconductor stack 13, and flows from the semiconductor stack 13 to the first electrical connection layer 14. The arrows shown in FIG. 2 indicate schematically a direction of the electric current flowing through the conventional light-emitting chip 1. Since the P-type electrode 12 has a high current density, it is likely to cause local heat accumulation and brightness reduction problems in the conventional light-emitting chip 1.

SUMMARY

Therefore, an object of the disclosure is to provide a light-emitting chip, a light-emitting device, and an optical-projecting device that can alleviate at least one of the drawbacks of the prior art. In this disclosure, the light-emitting chip is provided with an improved current spread, reduced heat accumulation, and improved brightness.

According to a first aspect of the present disclosure, the light-emitting chip includes a light-emitting unit, a first electrode unit, and a second electrode unit. The light-emitting unit includes a first conductivity type semiconductor layer, an active layer, and a second conductivity type semiconductor layer sequentially arranged along a first direction. The first electrode unit includes two first electrodes which are spaced apart from each other by a first distance, and which are electrically connected to the first conductivity type semiconductor layer. The second electrode unit includes two second electrodes which are electrically connected to the second conductivity type semiconductor layer. The first electrode unit and the second electrode unit are spaced apart from each other by a second distance, and the first distance is greater than the second distance.

According to a second aspect of the present disclosure, the light-emitting device includes at least one of the aforesaid light-emitting chip and a circuit board electrically connected to the light-emitting chip.

According to a third aspect of the present disclosure, the optical-projecting device includes at least one of the aforesaid light-emitting chip, a support for holding the light-emitting chip, and a power supply for supplying power to the light-emitting chip.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
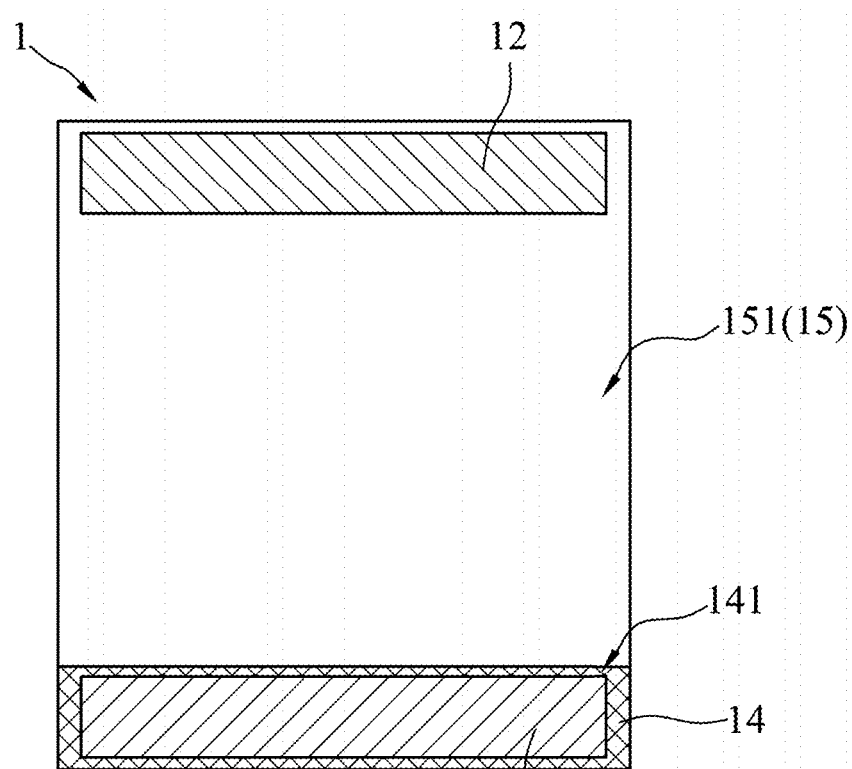
FIG. 1 is a schematic top view of a conventional light-emitting chip with a P-type electrode and an N-type electrode.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
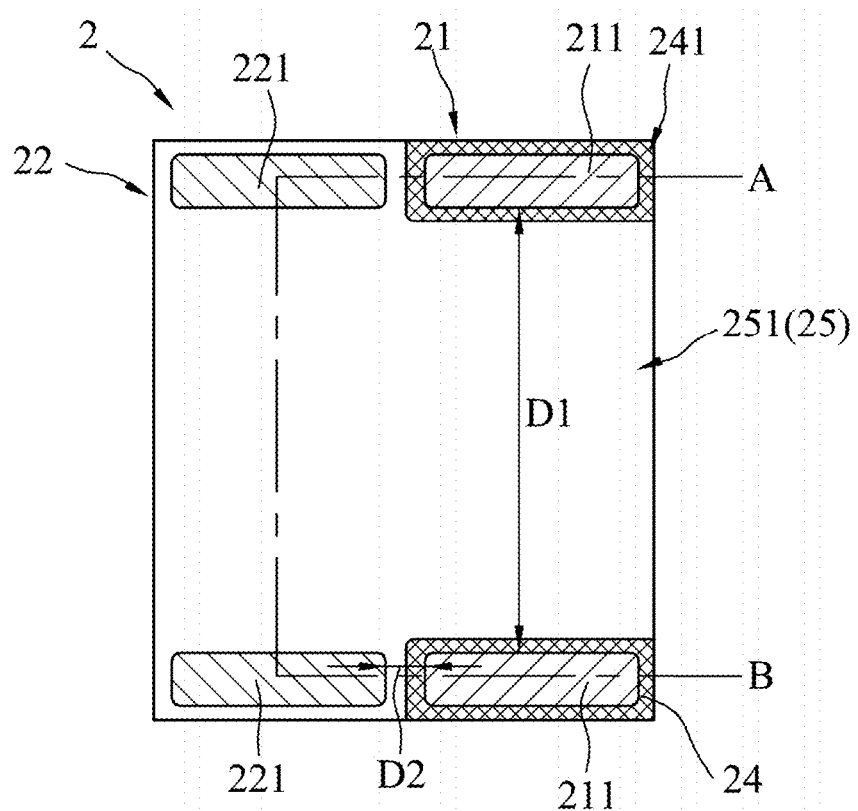
FIG. 3 is a schematic top view of a first embodiment of a light-emitting chip having two P-type electrodes and two N-type electrodes according to the present disclosure.
Figure 4:
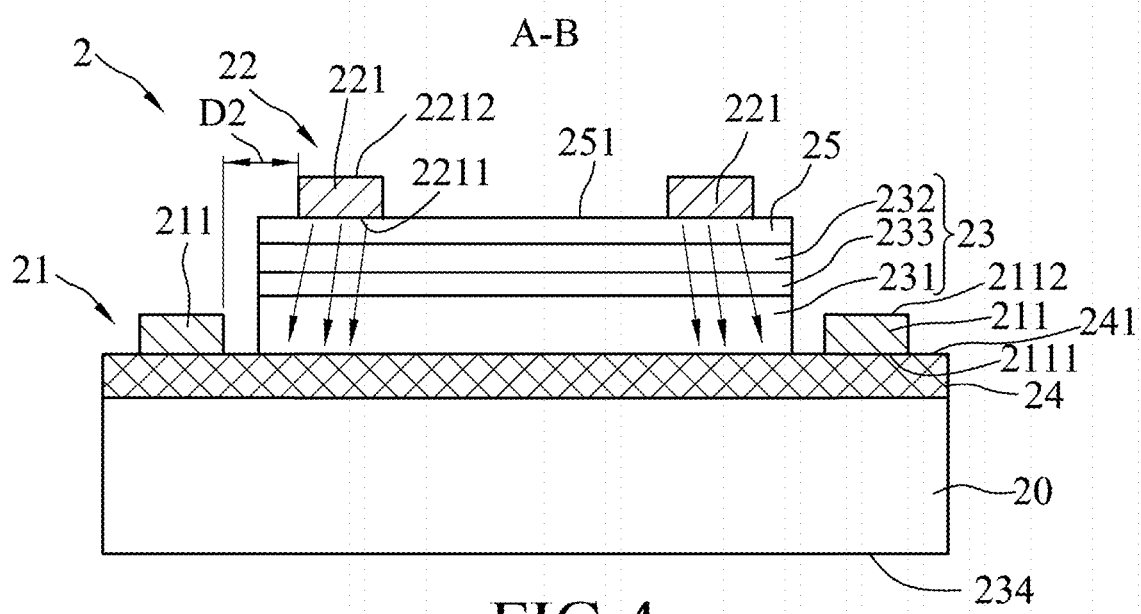
FIG. 4 is a perspective cross-sectional view along line A-B of the first embodiment of the light-emitting chip shown in FIG. 3.

Referring to FIGS. 3 and 4, a first embodiment of a light-emitting chip 2 according to the present disclosure is provided. FIG. 4 is a cross-sectional view along line A-B of the light-emitting chip 2 shown in FIG. 3. The light-emitting chip 2 includes an electrically insulating substrate 20, a first electrode unit 21, a second electrode unit 22, and a light-emitting unit 23. The first electrode unit 21, the second electrode unit 22, and the light-emitting unit 23 are disposed on the electrically insulating substrate 20. The light-emitting unit 23 includes a first conductivity type semiconductor layer 231, an active layer 233, and a second conductivity type semiconductor layer 232 sequentially arranged along a first direction. The first electrode unit 21 includes two first electrodes 211 which are spaced apart from each other by a first distance (D1) and which are electrically connected to the first conductivity type semiconductor layer 231. In some embodiments, the first conductivity type semiconductor layer 231 is an N-type semiconductor layer, and the first electrodes 211 are N-type electrodes. The second electrode unit 22 includes two second electrodes 221 which are electrically connected to the second conductivity type semiconductor layer 232. In some embodiments, the second conductivity type semiconductor layer 232 is a P-type semiconductor layer, and the second electrodes 221 are P-type electrodes. In this embodiment, the first electrode unit 21 and the second electrode unit 22 are spaced apart from each other by a second distance (D2), and the first distance (D1) is greater than the second distance (D2). Each of the first electrodes 211 and the second electrodes 221 has a projection on a surface of the electrically insulating substrate 20. The second distance (D2) is a minimum distance between the projection of one of the first electrodes 211 and the projection of a corresponding one of the second electrodes 221 that is relatively close to the one of the first electrodes 211. The two first electrodes 211 are spaced apart from the light-emitting unit 23 and respectively disposed at opposite sides of the light-emitting unit 23. The two second electrodes 221 are respectively disposed on the light-emitting unit 23 at opposite sides of the light-emitting unit 23.

In some embodiments, the first electrode unit 21 may have a plurality of pairs of the first electrodes 211, and the second electrode unit 22 may have a plurality of pairs of the second electrodes 221. In certain embodiments, the light-emitting chip 2 includes 2n of the first electrode unit 21, n being a positive integer. In certain embodiments, the light-emitting chip 2 includes 2m of the second electrode unit 22, m being a positive integer.

In some embodiments, each of the first electrodes 211 and the second electrodes 221 has a rectangular cross-section perpendicular to the first direction. The rectangular cross-section has a long side and a short side. In certain embodiments, the long side has a length that is about 4 times to about 8 times a length of the short side, which is convenient for multiple wires to bond to a single electrode since the greater the length of the long side of the electrodes (i.e., the first electrodes 211 and the second electrodes 221), the larger the area available for connecting the wires. In certain embodiments, the length of the short side ranges from about 30 μm to about 80 μm.

In some embodiments, the light-emitting chip 2 may further include a first electrical interconnection layer 24 and a second electrical interconnection layer 25. The first electrical interconnection layer 24 electrically connects the first electrodes 211 of the first electrode unit 21 to the first conductivity type semiconductor layer 231. The second electrical interconnection layer 25 electrically connects the second electrodes 221 of the second electrode unit 22 to the second conductivity type semiconductor layer 232. The first electrical interconnection layer 24 may be disposed under the first conductivity type semiconductor layer 231 and may have an exposed portion exposed from the first conductivity type semiconductor layer 231. The exposed portion functions as a first platform 241 on which the first electrodes 211 are disposed. The second electrical interconnection layer 25 is formed with a second platform 251 to support the second electrodes 221 (i.e., the second electrodes 221 of the second electrode unit 22 are disposed on the second electrical interconnection layer 25). In certain embodiments, the active layer 233 may be disposed between the first electrical interconnection layer 24 and the second electrode unit 22. In some embodiments, each of the second electrodes 221 has a first surface 2211 and a second surface 2212 opposite to the first surface 2211. The first surface 2211 of each of the second electrodes 221 faces toward the active layer 233, and the second surface 2212 of each of the second electrodes 221 faces toward the first direction (i.e., facing a direction away from the active layer 233). Each of the first electrodes 211 has a first surface 2111 and a second 2112 opposite to the first surface 2111. The first surface 2111 of each of the first electrodes 211 faces toward the first electrical interconnection layer 24, and the second surface 2112 of each of the first electrodes 211 faces toward the first direction (i.e., faces a direction away the from first electrical interconnection layer 24). In other words, in this embodiment, the light-emitting chip 2 is a lateral light-emitting chip.

In some chip manufacturing processes, semiconductor layers (i.e., the first conductivity type semiconductor layer 231, the active layer 233, and the second conductivity type semiconductor layer 232) are sequentially grown on a temporary substrate (not shown) by vapor deposition, and then the temporary substrate is separated from the semiconductor layers by laser or etching techniques. The first electrical interconnection layer 24 is then formed on the first conductivity type semiconductor layer 231, and the first electrical interconnection layer 24 is bonded to the electrically insulating substrate 20. In this embodiment, the first electrical interconnection layer 24 is disposed between the electrically insulating substrate 20 and the first conductivity type semiconductor layer 231. In certain embodiments, the light-emitting chip 2 has an area that ranges from about 1 mm² to about 3 mm². To be specific, the electrically insulating substrate 20 of the light-emitting chip 2 has a surface 234 distal from the first electrical interconnection layer 24. The surface 234 has an area that ranges from about 1 mm² to about 3 mm².

The arrows shown in FIG. 4 indicate schematically a direction of electric current paths which are optimized in the light-emitting chip 2. The electric current flows from the second electrodes 221 into the light-emitting chip 2. When the lateral current spreading ability of the light-emitting unit 23 is low, the current tends to concentrate mainly under the second electrodes 221. Therefore, in some embodiments, the first distance (D1) is at least 10 times greater than the second distance (D2) so as to control current distribution in the light-emitting chip 2. In this embodiment, the light-emitting chip 2 has a rectangular cross-section that is perpendicular to the first direction and that has a long side and a short side. In some embodiments, the first distance (D1) is greater than about 50% of a length of the long side of the rectangular cross-section of the light-emitting chip 2. The first electrodes 211 and the second electrodes 221 may be made of at least one of a material including, but not limited to, gold, tin, platinum, titanium, chromium, aluminum, and nickel.

The light-emitting chip 2 may have great reliability under a high current. In some embodiments, the light-emitting chip 2 may be operated under a current higher than 8A, and have a current density of greater than about 3 A/mm².

In high-current applications, the second electrodes 221 of this embodiment are disposed as far away as possible from each other on the second platform 251. By combining the aforesaid design of the second electrodes 221 with the design of the first electrodes 211 according to the present disclosure, the current can be laterally distributed on the second platform 251 to reduce current accumulation, which improves photoelectric performance of a product using the light-emitting chip 2 of the present disclosure.

Figure 5:
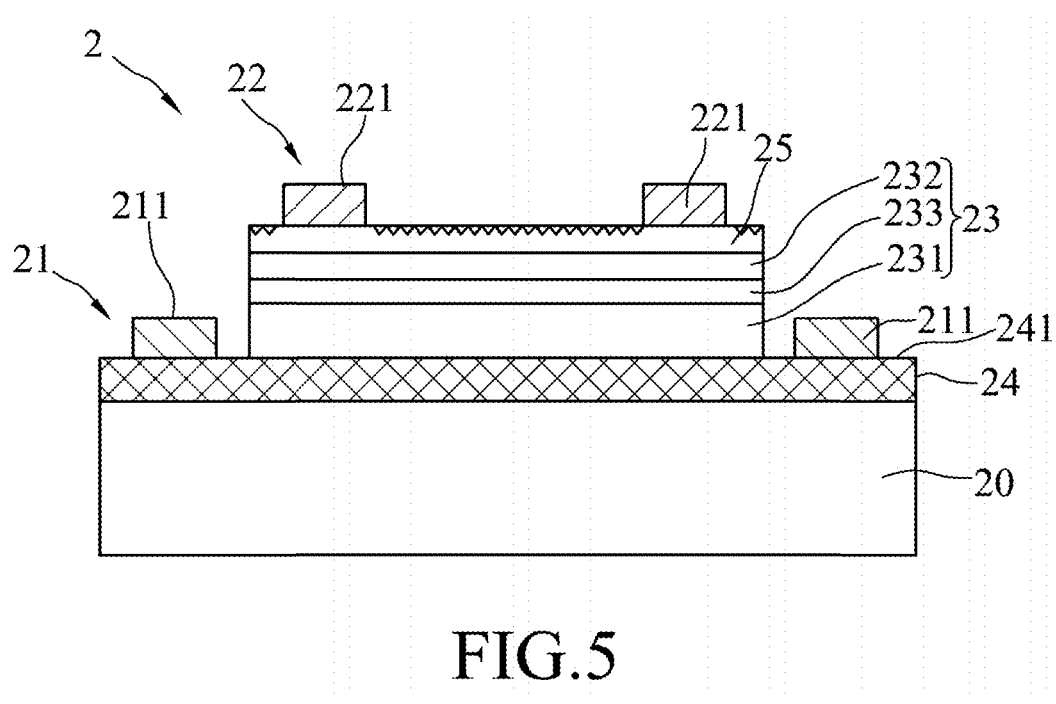
FIG. 5 is a perspective cross-sectional view of a second embodiment of the light-emitting chip according to the present disclosure.

Referring to FIG. 5, a second embodiment of the light-emitting chip 2 according to the present disclosure is provided. The second embodiment of the light-emitting chip 2 has a structure similar to that of the first embodiment, except that, in the second embodiment, the light-emitting chip 2 is a gallium arsenide-based light-emitting chip in which at least one of the first conductivity type semiconductor layer 231, the second conductivity type semiconductor layer 232, and the active layer 233 is a gallium arsenide-based layer made of a gallium arsenide-based material.

In this embodiment, the gallium arsenide-based material of the at least one the first conductivity type semiconductor layer the 231, second conductivity type semiconductor layer 232, and the active layer 233 has a carrier mobility (e.g., electron mobility) that is usually not greater than about 500 cm²/V·s. Since the carrier mobility of the gallium arsenide-based material is lower than that of gallium nitride, the lateral current spreading ability of the current in the light emitting unit 2 is relatively poor. Therefore, the second electrical interconnection layer 25 of the second embodiment of the light-emitting chip 2 disposed between the second conductivity type semiconductor layer 232 and the second electrodes 221 may be made of a metal, a transparent and electrically conductive material, or a doped semiconductor material to improve current spreading. For example, a doped gallium phosphide-based layer with a roughened surface may be disposed between the second conductivity type semiconductor layer 232 and the second electrodes 221 to serve as the second electrical interconnection layer 25. In certain embodiments, the doped gallium phosphide-based layer has an electron mobility of not greater than about 500 cm²/(V·s) and greater than that of the gallium arsenide-based material. The roughened surface of the doped gallium phosphide-based layer and a light-exiting surface of the light-emitting chip 2 face toward a same direction so that light extraction is efficiency improved. In some embodiments, the doped gallium phosphide-based layer has a thickness that ranges from about 2 µm to about 4 µm. In certain embodiments, the doped gallium phosphide-based layer includes magnesium. In some other embodiments, the second electrical interconnection layer 25 may be a transparent current spreading layer.

Figure 2:
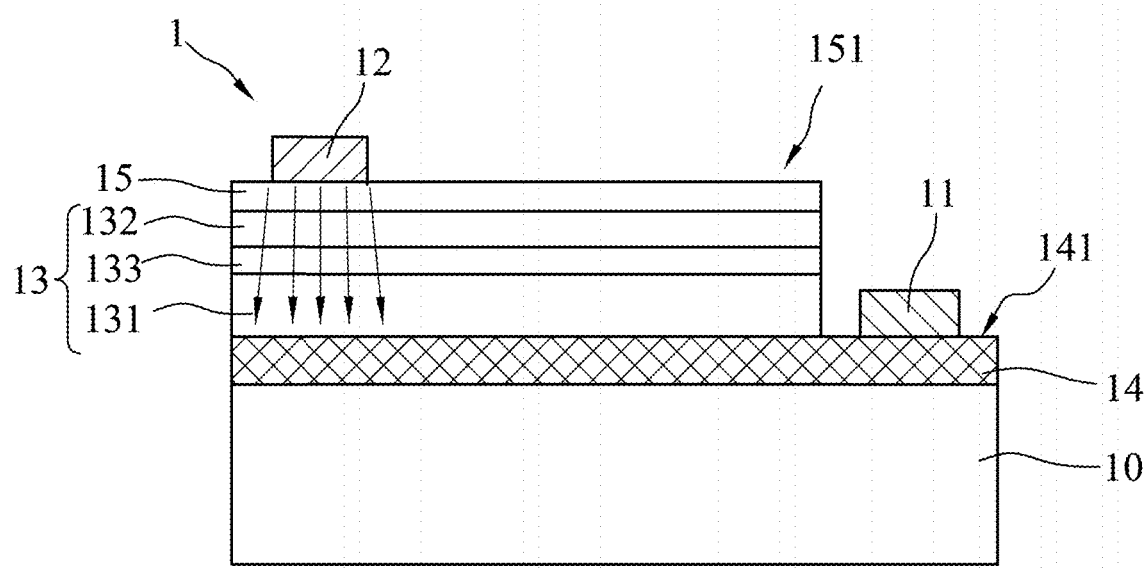
FIG. 2 is a perspective front view of the conventional light-emitting chip.
Figure 6:
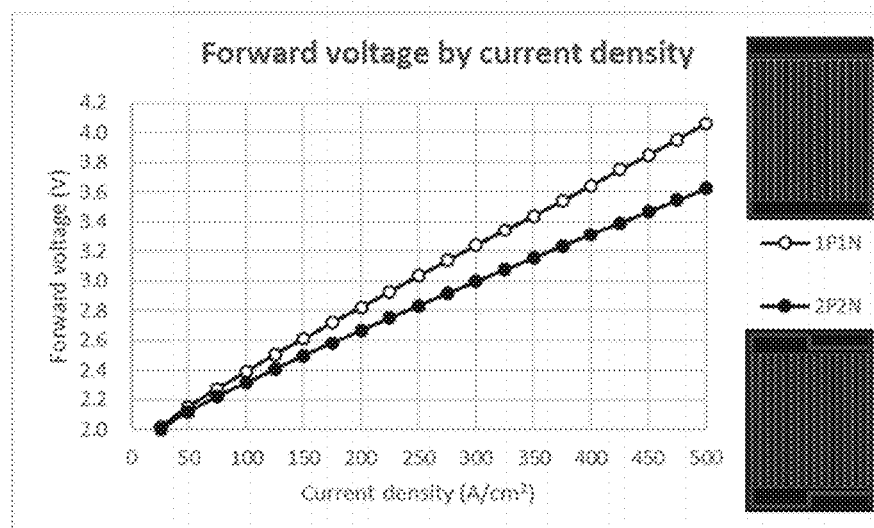
FIG. 6 is a plot showing forward voltages of the conventional light-emitting chip and the second embodiment of the light-emitting chip of the present disclosure at different current densities.
Figure 7:
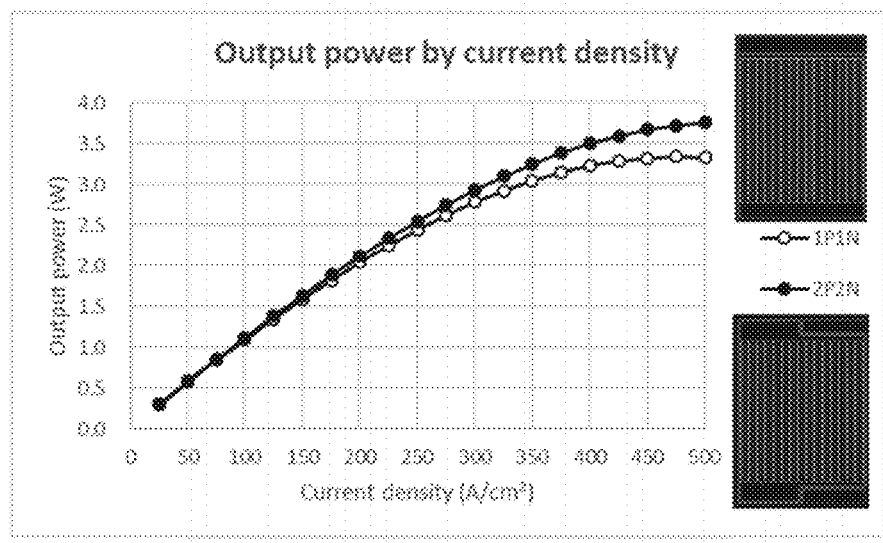
FIG. 7 is a plot showing output power of the conventional light-emitting chip and the second embodiment of the light-emitting chip of the present disclosure at different current densities.
Figure 8:
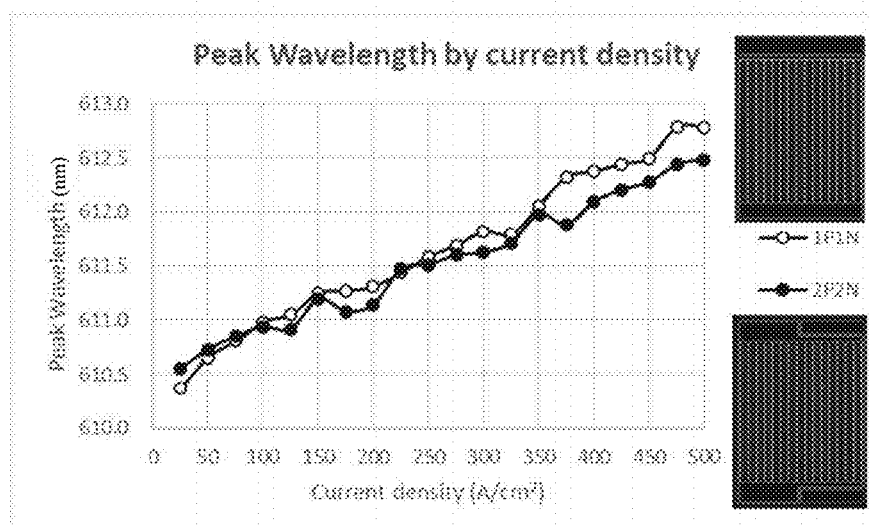
FIG. 8 is a plot showing peak wavelengths of the conventional light-emitting chip and the second embodiment of the light-emitting chip of the present disclosure at different current densities.

Referring to FIGS. 6 to 8, forward voltage, output power, and peak wavelength at different current densities are compared between the conventional light-emitting chip 1 with the 1P1N electrode layout (see FIGS. 1 and 2) and the second embodiment of the light-emitting chip 2 with the 2P2N electrode layout. The conventional light-emitting chip 1 and the second embodiment of the light-emitting chip 2 used for testing in the present disclosure are both red p-side up light-emitting chips. The data show that under the same epitaxial process conditions, the second embodiment of the light-emitting chip 2 (i.e., the light-emitting chip with the 2P2N electrode layout) has an improved photoelectric efficiency and a reduced forward voltage compared with the conventional light-emitting chip 1 (i.e., the light-emitting chip with the 1P1N electrode layout) at a current density below 500 A/cm$^2$, that is, below 5 A/mm$^2$, with each of the light-emitting chips 1, 2 having a chip area of 2 mm$^2$. Compared with the conventional light-emitting chip 1, at 500 A/cm$^2$, the forward voltage ($V_f$) of the second embodiment of the light-emitting chip 2 is reduced by about 0.4 V (shown in FIG. 6), the output power (i.e., brightness) of the second embodiment of the light-emitting chip 2 is increased by about 0.5 W (shown in FIG. 7), a wall-plug efficiency (WPE) of the second embodiment of the light-emitting chip 2 is increased by about 24% (can be inferred from the results shown in FIGS. 6 and 7), and the saturation current of the second embodiment of the light-emitting chip 2 has increased. The aforesaid measured data shows that reliability of the light-emitting chip 2 operating under high current conditions has improved.

In addition, the degree of red shift of the second embodiment of the light-emitting chip 2 is slightly different from that of the conventional light-emitting chip 1 as current density increases, which also suggests that the overall current distribution and heat distribution has improved by optimization of the electrode layout, i.e., using the 2P2N electrode layout of the present disclosure.

Figure 9:
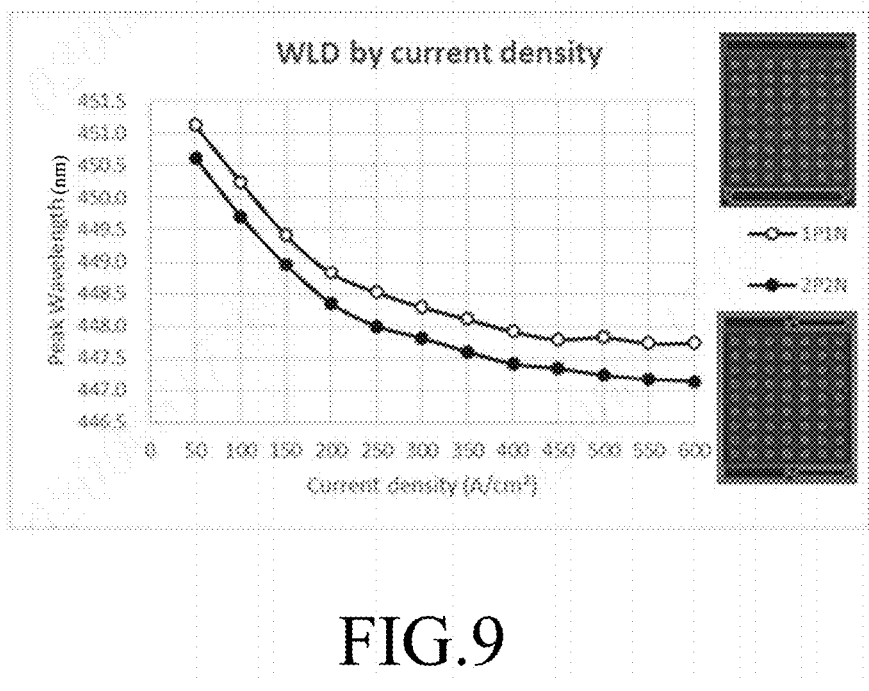
FIG. 9 is a plot showing main wavelengths (WLD) of the conventional light-emitting chip and a third embodiment of the light-emitting chip of the present disclosure at different current densities.

A third embodiment of the light-emitting chip 2 of the present disclosure has a structure similar to that of the second embodiment, except that in the third embodiment, the light-emitting chip 2 is a gallium nitride-based light-emitting chip in which at least one of the first conductivity type semiconductor layer 231, the second conductivity type semiconductor layer 232, and the active layer 233 is a gallium nitride-based layer. Referring to FIG. 9, due to the 2P2N electrode layout of the third embodiment of the light-emitting chip 2, the current path in the light-emitting chip 2 is improved, and the WPE is also improved compared with those of the conventional light-emitting chip 1. Since gallium arsenide has a carrier mobility lower than that of gallium nitride, the overall improvement relative to the 1P1N electrode layout may not be as large as that of the gallium arsenide-based light-emitting chip 2 disclosed in the second embodiment.

Figure 10:
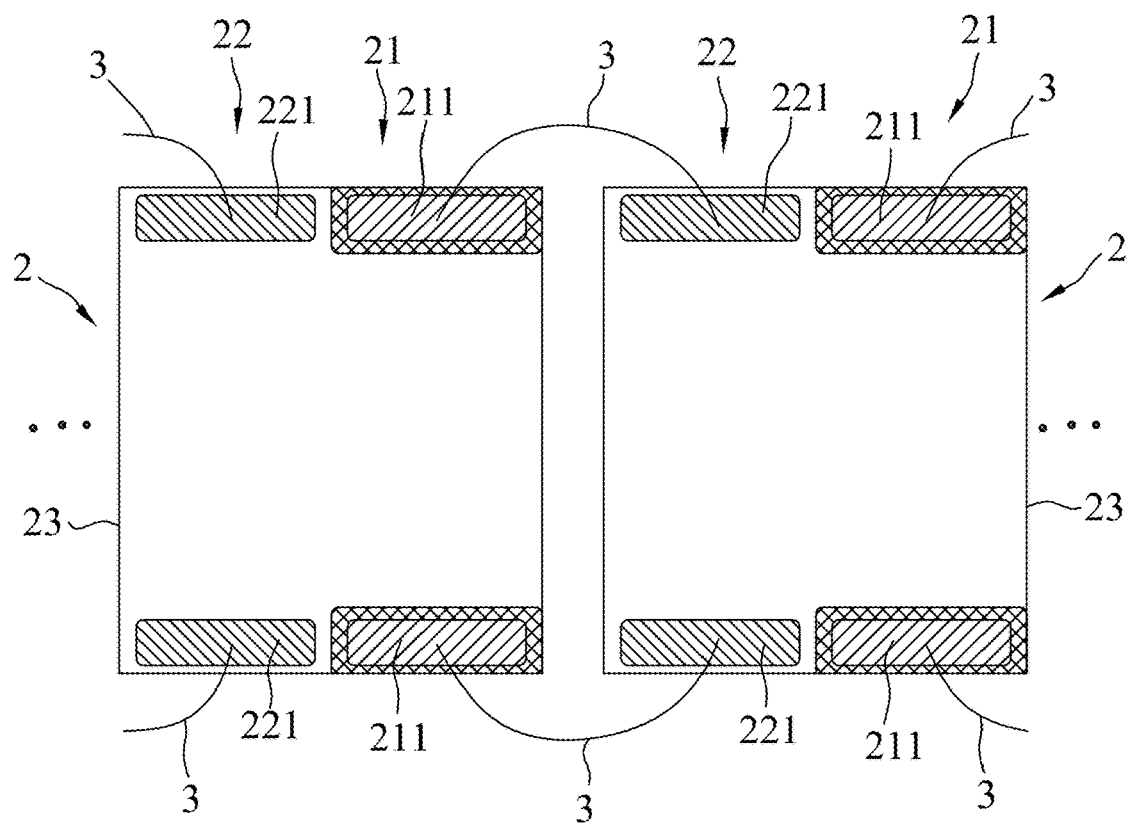
FIGS. 10 and 11 are schematic top views of a fourth embodiment of the light-emitting chip according to the present disclosure.

In order to meet the packaging requirements of a high-voltage device or a series connecting device, a fourth embodiment of the light-emitting chip 2, which is a light-emitting device including the light-emitting chip 2 of the present disclosure, is provided. The light-emitting device includes a plurality of the light-emitting chips 2, and the light-emitting chips 2 are electrically connected to each other. Referring to FIG. 10, the light-emitting chips 2 are electrically connected by wires 3. Each of the light-emitting chips 2 has a structure the same as any of the first to third embodiments. Since the first electrodes 211 and the second electrodes 221 are located at opposite sides of the light-emitting unit 23, such design facilitates wire connection between the light-emitting chips 2 of the light-emitting device, which simplifies circuit design of the light-emitting device and shortens wiring distance.

Figure 11:
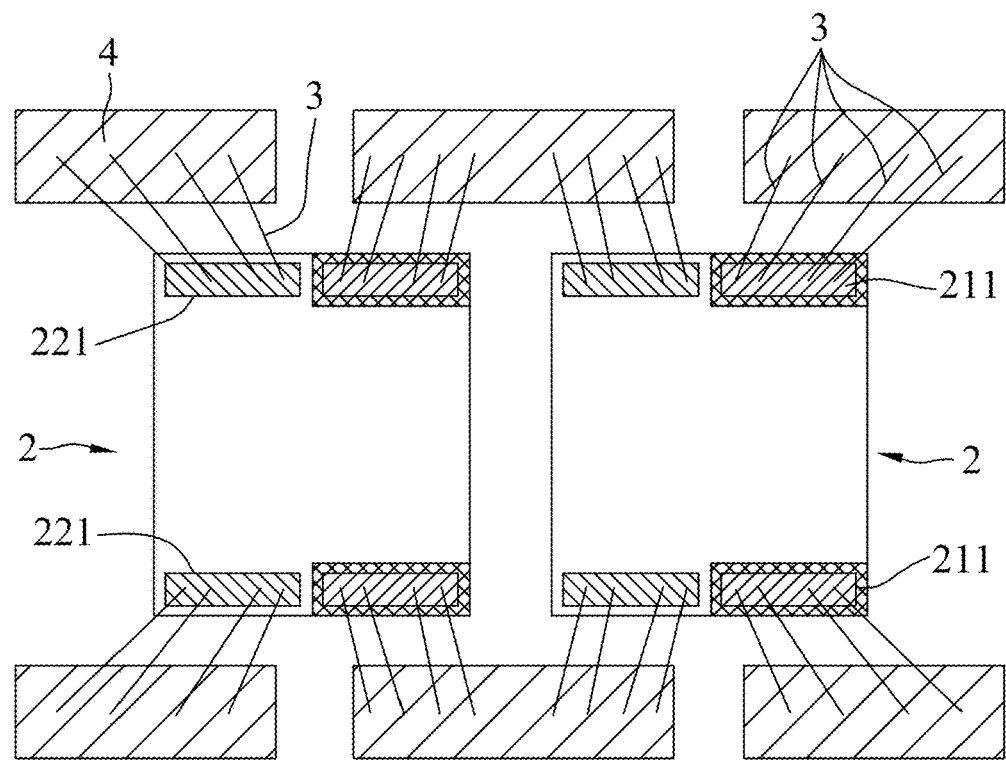

Referring to FIG. 11, as mentioned in the first embodiment, each of the first electrodes 211 and the second electrodes 221 of the light-emitting device has the rectangular cross-section, which has the long side and the short side. In certain embodiments, the short side has a length that ranges from about 30 μm to about 80 μm. When the light-emitting device is applied with a high current, for example, a current greater than 3 A, multiple wires 3 are used for shunting the current.

To be specific, in this embodiment, two light-emitting chips 2 are connected in series in the light-emitting device. In this embodiment, four wires 3 are preferably used to connect each of the electrodes (i.e., the first and second electrodes 211, 221) and the circuit board 4, and the four wires 3 are designed to shunt the input current.

In some embodiments, connection between the light-emitting chips 2 of the light-emitting device can be altered according to the locations of the first and second electrodes 211, 221.

Figure 12:
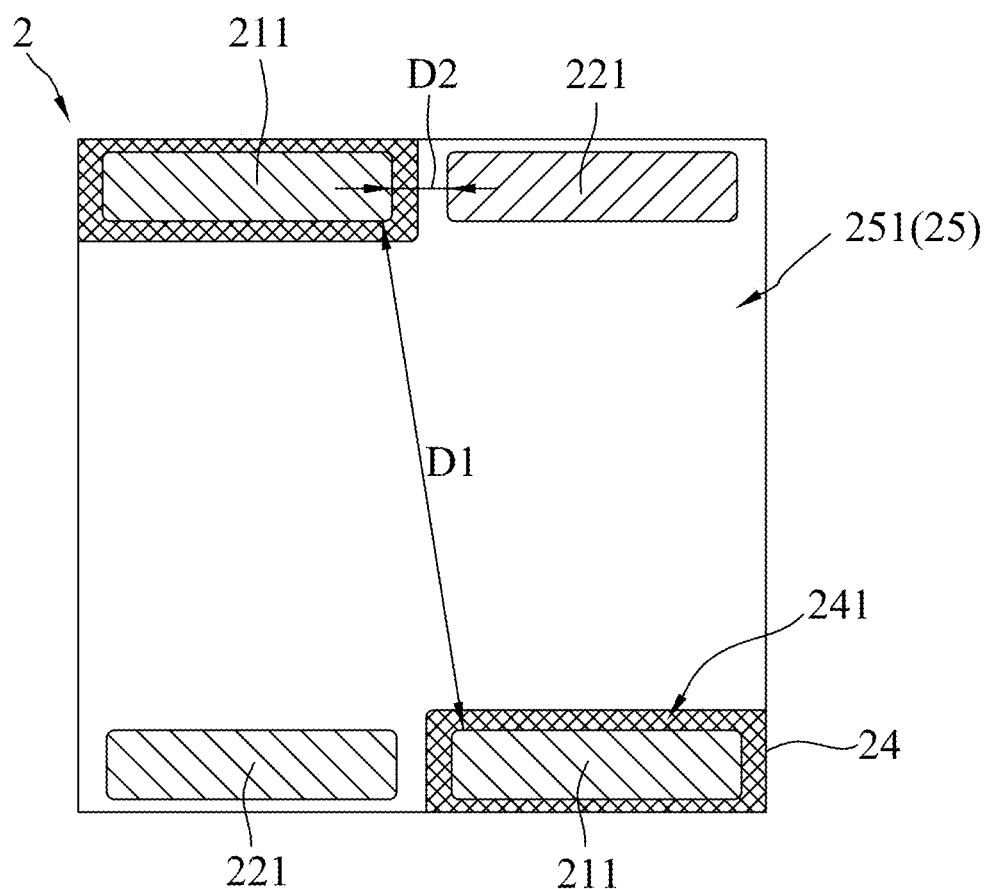
FIG. 12 is a schematic top view of a fifth embodiment of the light-emitting chip according to the present disclosure.

Referring to FIG. 12, a fifth embodiment of the light-emitting chip 2 of the present disclosure is provided. The fifth embodiment of the light-emitting chip 2 has a structure similar to that of the first embodiment, except that in the fifth embodiment, the first electrodes 211 of the first electrode unit 21 are arranged diagonally with respect to the light-emitting unit 23, disposed at opposite sides of the light-emitting unit 23, and are spaced apart from the light-emitting unit 23 and the second electrodes 221. The second electrodes 221 of the second electrode unit 22 are arranged diagonally at opposite sides of the light-emitting unit 23, disposed on the light-emitting unit 23, and are spaced apart from the first electrodes 211. The distance (D1) between the first electrodes 211 is greater than the distance (D2) between the one of the first electrodes 211 and the second electrode 212 adjacent to the first electrode 211.

Figure 13:
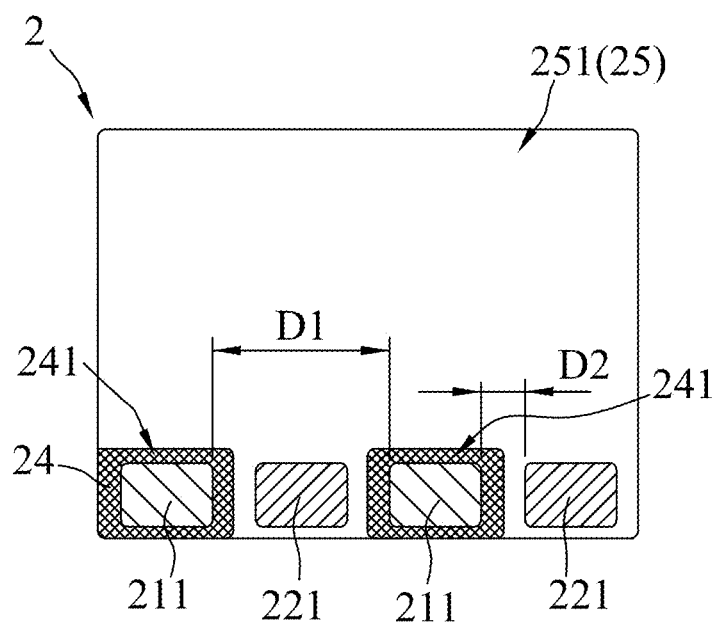
FIG. 13 is a schematic top view of a sixth embodiment of the light-emitting chip according to the present disclosure.

Referring to FIG. 13, a sixth embodiment of the light-emitting chip 2 of the present disclosure is provided. By removing a portion of the light-emitting unit 23 to expose the first electrical interconnection layer 24, a plurality of the first platforms 241 (i.e., exposed portions of the first electrical interconnection layer 24) are formed and are arranged at intervals at one side of the light-emitting unit 23. In this embodiment, the first electrodes 211 and the second electrodes 221 are alternately arranged at one side of the light-emitting unit 23 and are spaced apart from each other. The distance (D1) between the first electrodes 211 is greater than the distance (D2) between one of the first electrodes 211 and a corresponding one of the second electrodes 221 that is adjacent to the one of the first electrodes 211.

An optical-projecting device including one of the light-emitting chips 2 and the light-emitting devices disclosed in the first to sixth embodiments of the present disclosure is also disclosed. To be specific, the optical-projecting device includes one of the light-emitting chips 2 and the light-emitting devices disclosed in the first to sixth embodiments, a support for holding the light-emitting chip 2 and/or the light-emitting device, and a power supply for supplying power to the light-emitting chip 2 and/or the light-emitting device. The support may be, but not limited to, a box or a frame structure.

The embodiments of the present disclosure have the following advantages. The light-emitting chip of the present disclosure is mainly used for producing gallium arsenide-based epitaxial products that emits red light, and is designed so that under a high current density, the light-emitting chips a reduced working voltage, an improved brightness, an improved photoelectric conversion efficiency, and an increased saturation current. In addition, there is a slight difference in the degree of red shift of the light-emitting chip as current density increases, which also supports the fact that optimization of electrode distribution according to the present disclosure improves overall current distribution and heat distribution of the light-emitting chip. The light-emitting chip of the present disclosure may also be used for producing gallium nitride-based epitaxial products.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means feature, structure, or that a particular characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting chip comprising:
   a light-emitting unit including a first conductivity type semiconductor layer, an active layer, and a second conductivity type semiconductor layer sequentially arranged along a first direction;
   a first electrode unit including two first electrodes which are spaced apart from each other by a first distance, and which are electrically connected to said first conductivity type semiconductor layer; and
   a second electrode unit including two second electrodes which are electrically connected to said second conductivity type semiconductor layer,
   wherein
   said first electrode unit and said second electrode unit are spaced apart from each other by a second distance,
   said first distance is greater than said second distance, and
   said second electrode unit is not disposed between said first electrodes.

2. The light-emitting chip as claimed in claim 1, wherein said first electrodes of said first electrode unit are spaced apart from said light-emitting unit and respectively disposed at opposite sides of said light-emitting unit.

3. The light-emitting chip as claimed in claim 1, wherein said second electrodes of said second electrode unit are respectively disposed on said light-emitting unit at opposite sides of said light-emitting unit.

4. The light-emitting chip as claimed in claim 1, further comprising a first electrical interconnection layer and a second electrical interconnection layer, said first electrical interconnection layer electrically connecting said first electrodes of said first electrode unit to said first conductivity type semiconductor layer, said second electrical interconnection layer electrically connecting said second electrodes of said second electrode unit to said second conductivity type semiconductor layer,
   wherein
   said first electrical interconnection layer is disposed under said first conductivity type semiconductor layer and has an exposed portion exposed from said first conductivity type semiconductor layer,
   said first electrodes of said first electrode unit are disposed on said exposed portion of said first electrical interconnection layer, and
   said second electrodes of said second electrode unit are disposed on said second conductivity type semiconductor layer.

5. The light-emitting chip as claimed in claim 4, wherein said active layer is disposed between said first electrical interconnection layer and said second electrode unit.

6. The light-emitting chip as claimed in claim 1, wherein said first conductivity type semiconductor layer has an electron mobility of not greater than 500 $cm^2/V \cdot s$.

7. The light-emitting chip as claimed in claim 1, wherein said second conductivity type semiconductor layer has an electron mobility of not greater than 500 $cm^2/V \cdot s$.

8. The light-emitting chip as claimed in claim 1, wherein at least one of said first conductivity type semiconductor layer, said second conductivity type semiconductor layer, and said active layer is a gallium arsenide-based layer.

9. The light-emitting chip as claimed in claim 1, further comprising an electrical interconnection layer disposed between said second conductivity type semiconductor layer and said second electrode unit.

10. The light-emitting chip as claimed in claim 9, wherein said electrical interconnection layer is a transparent current spreading layer.

11. The light-emitting chip as claimed in claim 9, wherein said electrical interconnection layer is a doped gallium phosphide-based layer, said doped gallium phosphide-based layer having a roughened surface.

12. The light-emitting chip as claimed in claim 11, wherein said doped gallium phosphide-based layer has an electron mobility of not greater than 500 $cm^2/(V \cdot s)$.

13. The light-emitting chip as claimed in claim 11, wherein
   said doped gallium phosphide-based layer has a thickness that ranges from 2 μm to 4 μm; and
   said doped gallium phosphide-based layer includes magnesium.

14. The light-emitting chip as claimed in claim 4, further comprising an electrically insulating substrate, said first electrical interconnection layer being disposed between said electrically insulating substrate and said first conductivity type semiconductor layer.

15. The light-emitting chip as claimed in claim 14, wherein said electrically insulating substrate has a surface distal from said first electrical interconnection layer, said surface having an area that ranges from 1 $mm^2$ to 3 $mm^2$.

16. The light-emitting chip as claimed in claim 1, wherein
   each of said second electrodes has a first surface and a second surface opposite to said first surface, said first surface of each of said second electrodes facing toward said active layer and said second surface of each of said second electrodes facing toward said first direction; and
   each of said first electrodes has a first surface and a second surface opposite to said first surface, said first surface of each of said first electrodes facing toward said first direction.

17. The light-emitting chip as claimed in claim 1, wherein said light-emitting chip has a current density of greater than 3 $A/mm^2$.

18. The light-emitting chip as claimed in claim 1, wherein said first distance is at least 10 times greater than said second distance.

19. The light-emitting chip as claimed in claim 1, wherein:
   said light-emitting chip has a rectangular cross-section perpendicular to said first direction, said rectangular cross-section having a long side and a short side; and said first distance is greater than 50% of a length of said long side of said rectangular cross-section of said light-emitting chip.

20. The light-emitting chip as claimed in claim 1, wherein each of said first electrodes and said second electrodes is made of a material including one of gold, tin, platinum, titanium, chromium, aluminum, nickel, and combinations thereof.

21. The light-emitting chip as claimed in claim 1, wherein:
   each of said first electrodes and said second electrodes has a rectangular cross-section perpendicular to said first direction, said rectangular cross-section having a long side and a short side; and
   said short side has a length that ranges from 30 µm to 80 µm.

22. The light-emitting chip as claimed in claim 1, wherein:
   each of said first electrodes and said second electrodes has a rectangular cross-section perpendicular to said first direction, said rectangular cross-section having a long side and a short side; and
   said long side has a length that is 4 times to 8 times a length of said short side.

23. The light-emitting chip as claimed in claim 1, wherein:
   said light-emitting chip includes 2n of said first electrode unit, n being a positive integer; and
   said light-emitting chip includes 2m of said second electrode unit, m being a positive integer.

24. A light-emitting device comprising:
   at least one light-emitting chip as claimed in claim 1; and
   a circuit board electrically connected to said light-emitting chip.

25. The light-emitting device as claimed in claim 24, wherein said light-emitting device includes a plurality of said light-emitting chips, said light-emitting chips being electrically connected to each other.

26. An optical-projecting device comprising:
   at least one light-emitting chip as claimed in claim 1;
   a support for holding said light-emitting chip; and
   a power supply for supplying power to said light-emitting chip.

* * * * *